United States Patent [19]
Yamashita et al.

[11] Patent Number: 6,077,355
[45] Date of Patent: Jun. 20, 2000

[54] APPARATUS AND METHOD FOR DEPOSITING A FILM ON A SUBSTRATE BY CHEMICAL VAPOR DEPOSITION

[75] Inventors: Atsushi Yamashita; Toru Tatsumi, both of Tokyo, Japan

[73] Assignee: NEC Corporation, Tokyo, Japan

[21] Appl. No.: 08/869,887

[22] Filed: Jun. 5, 1997

[30] Foreign Application Priority Data

Jun. 20, 1996 [JP] Japan ................................. 8-160116

[51] Int. Cl.[7] .................................................. C23C 16/00
[52] U.S. Cl. ........................... 118/708; 118/712; 118/715
[58] Field of Search ................................... 118/708, 712, 118/715

[56] References Cited

U.S. PATENT DOCUMENTS 5,540,777   7/1996   Barbee ..................................... 118/708

FOREIGN PATENT DOCUMENTS

| | | |
|---|---|---|
| 55-117229 | 9/1980 | Japan . |
| 5-62031 | 8/1993 | Japan . |
| 6-13327 | 1/1994 | Japan . |
| 6-342761 | 12/1994 | Japan . |
| 9-324268 | 12/1997 | Japan . |

*Primary Examiner*—Richard Bueker
*Attorney, Agent, or Firm*—Whitham, Curtis & Whitham

[57] ABSTRACT

There is provided an apparatus for accomplishing chemical vapor deposition, including a reaction chamber in which a film is deposited on a substrate by chemical vapor deposition, a source supply for supplying source to the reaction chamber for accomplishing chemical vapor deposition, and a mass spectrograph for detecting a concentration of the source in the reaction chamber and transmitting an instruction signal based on detection to the source supply for controlling an amount of the source to be supplied to the reaction chamber. It was quite difficult to control an amount of solid or liquid source to be supplied to a chemical vapor deposition apparatus. The above mentioned apparatus makes it possible to accurately control an amount of solid or liquid source, resulting in uniformity in a film deposition rate and a film composition.

8 Claims, 4 Drawing Sheets

APPARATUS AND METHOD FOR DEPOSITING A FILM ON A SUBSTRATE BY CHEMICAL VAPOR DEPOSITION

BACKGROUND OF THE INVENTION

1. Field of the Invention

The invention relates to an apparatus and a method to be employed in semiconductor device fabrication for depositing a film on a substrate by chemical vapor deposition, and more particularly to an apparatus and a method for accomplishing chemical vapor deposition in which solid or liquid source is used.

2. Description of the Related Art

There has been employed chemical vapor deposition (hereinafter, referred to simply as "CVD") in order to form a capacity film or an insulating film of a semiconductor device. In CVD, a source including an ingredient or ingredients of which a film is intended to be made of is introduced in a gas condition into a reaction chamber in which a substrate is placed, and a gas source is made into reaction by heating to thereby deposit a film on a substrate. Thus, a source to be used for CVD is necessary to be gaseous at room temperature (RT).

However, as materials such as tantalum oxide, strontium titanate and lead titanate zirconate have been employed for semiconductor device fabrication, source which is in solid or liquid condition at room temperature is often employed for CVD. The reason is that gas sources containing ingredients of those materials are scarce.

An amount of source which is gaseous at room temperature might be readily controlled by employing a flow rate controller such as a mass flow controller (hereinafter, referred to simply as "MFC"). In contrast, source which is in solid or liquid condition at room temperature has in general a low vapor pressure, and hence it would be more difficult to control an amount of solid or liquid source than an amount of a gas source.

When CVD is accomplished employing a solid or liquid source, there has been conventionally carried out a method in which a container containing a solid or liquid source is heated to thereby evaporate the solid or liquid source, and the thus evaporated source is introduced into MFC for directly controlling a flow rate of the evaporated source. Since this method controls an amount of source to be supplied in the form of a flow rate, the method provides sufficient repeatability.

However, the above mentioned conventional method has a problem that a system for supplying source, including MFC, has to be heated at a temperature higher than a condensation point of a source. Accordingly, a temperature of a source has to be kept lower than a maximum temperature against which MFC has heat resistance, because MFC has in general the most poor heat resistance.

In addition, there has to be created a difference in pressure between a gas inlet port and a gas exhaust port of MFC in order to control a flow rate of a source by means of MFC.

Accordingly, it is impossible in the above mentioned conventional method to supply a source having a low vapor pressure and hence generating no pressure at a temperature lower than the maximum temperature against which MFC has heat resistance, even if the gas exhaust port of MFC which is in communication with a CVD reaction chamber is made evacuated. That is, the method has a problem that only materials having a relatively high vapor pressure can be employed as a source.

In another method of accomplishing CVD employing a solid or liquid source, a container containing a source therein is kept at a constant temperature, and a predetermined amount of carrier gas controlled in a flow rate by MFC is introduced into the container, to thereby introduce the source into a CVD reaction chamber together with the carrier gas. In general, an inert gas such as argon (Ar) is used as a carrier gas.

In this method, a system for supplying a source to a CVD reaction chamber, including the container, is necessary to be heated at a temperature higher than a condensation point of a source, either. However, since MFC is located upstream of the source container, a degree in a temperature increase is not so high as that of the previously mentioned method. Hence, this method makes it possible to employ a source which has a low vapor pressure and is difficult to be evaporated. This method has been widely employed because of this advantage. In this method, an amount of a source to be supplied to a CVD reaction chamber is controlled by a temperature of a source container, a pressure in a source container, and a flow rate of a carrier gas.

In a method in which a source is supplied together with a carrier gas, an amount of a source is defined in accordance with the following equation (A).

$$n F \times \alpha Ps/(P - \alpha Ps) \qquad (A)$$

In the equation (A), n indicates an amount of a source to be supplied, F indicates an amount of a carrier gas, P indicates a total pressure in a source container, Ps indicates a saturation vapor pressure of a source, and $\alpha$ indicates a degree of saturation of a source. The degree of saturation $\alpha$ is a coefficient indicating whether a partial pressure of a source in a source container reaches a saturation pressure thereof. A source is supplied to a CVD reaction chamber in such a condition that the degree of saturation $\alpha$ is equal to 1 (one), that is, a partial pressure of a source in a source container is equal to a saturation pressure thereof. The saturation pressure Ps of a source is dependent only on a temperature, and is higher at a higher temperature. As would be obvious in view of the equation (A), when the degree of saturation $\alpha$ is equal to 1, an amount of a source to be supplied to a CVD reaction chamber is dependent on a temperature of a source, a pressure in a source container, and a flow rate of a carrier gas. These factors are optimized in film deposition by CVD in order to obtain a desired film deposition rate and film composition.

However, the above mentioned method employing a carrier gas for supplying a source to a CVD reaction chamber has a problem that it is impossible to know an amount of a source having been actually supplied to a CVD reaction chamber. Because, even if an amount of a carrier gas, a temperature of a source container, and a pressure of a source container are fixed in optimal values to thereby deposit a film, an amount of a source having been actually supplied to a CVD reaction chamber is varied due to fluctuation in a temperature of a source container and decrease in an amount of a source caused by repeated film deposition.

As mentioned above, it is impossible in the conventional method to keep an amount of a source at a constant, target amount, since the conventional method does not have means for detecting fluctuation in an amount of a source. The fluctuation in an amount of a source causes fluctuation in a film deposition rate which in turn causes deviation in a film thickness, and also causes deviation in film composition from an intended composition in the case of polyphyletic film formation, resulting in deviation in film characteristics from intended ones. Namely, there cannot be obtained sufficient repeatability in film deposition by CVD, which in turn reduces productivity in semiconductor device fabrication.

SUMMARY OF THE INVENTION

In view of the above mentioned problems of conventional methods, it is an object of the present invention to provide an apparatus and a method which are capable of detecting and controlling an amount of a source in the form of solid or liquid in CVD which is to be accomplished employing a solid or liquid source, to thereby enhance repeatability of film deposition and hence productivity in semiconductor device fabrication.

In one aspect, there is provided an apparatus for depositing a film on a substrate by chemical vapor deposition, including (a) a reaction chamber in which a film is deposited on a substrate by chemical vapor deposition, (b) a source supply for supplying source to the reaction chamber for accomplishing chemical vapor deposition, and (c) a mass spectrograph for detecting a concentration of the source in the reaction chamber and transmitting an instruction signal based on detection to the source supply for controlling an amount of the source to be supplied to the reaction chamber.

The mass spectrograph may detect a concentration of the source by introducing a part of the source thereinto. The reaction chamber may be separated from the mass spectrograph, and the reaction chamber may be in liquid communication with the mass spectrograph, in which case, there may be disposed a nozzle for liquid-communicating the reaction chamber to the mass spectrograph.

The apparatus may further include vacuum devices for separately making said reaction chamber and said mass spectrograph evacuated. When a plurality of sources are to be employed, the apparatus may include a plurality of mass spectrographs for detecting concentrations of the sources. The mass spectrograph may detect a mass number of the source as an indication of a concentration of the source.

There is further provided an apparatus for depositing a film on a substrate by chemical vapor deposition, including (a) a reaction chamber in which a film is deposited on a substrate by chemical vapor deposition, (b) a source supply for supplying source to the reaction chamber for accomplishing chemical vapor deposition, (c) a system for supplying calibration gas to the reaction chamber, and (d) a mass spectrograph for detecting a concentration ratio of the source to the calibration gas and transmitting an instruction signal based on detection to the source supply for controlling an amount of the source to be supplied to the reaction chamber.

It is preferable that a gas which is not mixed with said source is used as a calibration gas.

In another aspect, there is provided a method of depositing a film on a substrate by chemical vapor deposition, including the steps of (a) supplying source into a reaction chamber in which a film is to be deposited on a substrate; and (b) detecting a concentration of the source in the reaction chamber and controlling an amount of the source to be supplied to the reaction chamber in accordance with detection.

It is preferable that the method further includes one or more of the following steps of: (c) increasing or decreasing vapor pressure of the source in order to increase or decrease an amount of source to be supplied to the reaction chamber; (d) making a temperature of the source higher or lower in order to increase or decrease an amount of source to be supplied to the reaction chamber; (e) increasing or decreasing an amount of a carrier gas in order to increase or decrease an amount of source to be supplied to the reaction chamber; and (f) increasing or decreasing a pressure in the reaction chamber in order to increase or decrease an amount of source to be supplied to the reaction chamber.

There may be prepared a plurality of sources for supplying to the reaction chamber, in which case, detection of a concentration is preferably accomplished for each of the sources. A mass number of the source may be detected as an indication of a concentration of the source.

There is further provided a method of depositing a film on a substrate by chemical vapor deposition, including the steps of (a) supplying source and calibration gas into a reaction chamber in which a film is to be deposited on a substrate, and (b) detecting a concentration ratio of the source to the calibration gas and controlling an amount of the source to be supplied to the reaction chamber in accordance with the concentration ratio.

An apparatus and a method for depositing a film on a substrate by CVD in accordance with the present invention have functions as follows. All molecules have their inherent mass numbers. A mass spectrograph puts all molecules existing in gas phase into groups having different mass numbers, and transmits signals having a magnitude dependent on the number of molecules. This signal magnitude may be considered as an indication of a gas concentration in gas phase. For a mixture gas containing a plurality of gas species, it is possible to detect a concentration of each of the gas species by means of a mass spectrograph.

The above mentioned operation of a mass spectrograph makes it possible to detect a gas concentration of each of gas species in a CVD reaction chamber while a film is being deposited on a substrate, by equipping a CVD reaction chamber with a mass spectrograph and introducing a part of a source into the mass spectrograph when a source is introduced into the CVD reaction chamber. Herein, an optimal source gas concentration in a CVD reaction chamber by which optimal film deposition rate and film composition can be obtained is in advance determined. Thus, by comparing the detected source gas concentration to the optimal source gas concentration, it can be judged as to whether an optimal amount of a source is supplied to a CVD reaction chamber.

When the thus obtained source gas concentration in a CVD reaction chamber is deviated from an intended gas concentration, an amount of a source gas is adjusted by feeding back to a system for supplying a source. In conventional methods of depositing a film on a substrate by CVD in which a solid or liquid source is employed, it is not possible to control an amount of a source so that a predetermined amount of a source is supplied to a CVD reaction chamber, however, simple increase or decrease in an amount of a source can be relatively readily accomplished by increasing or decreasing one or more of a temperature of a source container, a pressure in a source container, and a flow rate of a carrier gas.

Thus, if it is possible to detect a magnitude of a signal transmitted from a mass spectrograph, namely a source gas concentration in a CVD reaction chamber, negative feedback control could be carried out with respect to an amount of a source gas, resulting in that a source gas concentration can be kept at an intended value while a film is being deposited on a substrate. Keeping a source gas concentration constant in a CVD reaction chamber maintains repeatability of film characteristics such as a film deposition rate and a film composition with the result of enhanced productivity.

When a mass spectrograph is equipped in a CVD reaction chamber, a pressure at which CVD growth is made and contamination of the mass spectrograph have to be taken into consideration. If a pressure at which a film is deposited on a substrate by CVD is too high, a mass spectrograph may be contaminated by a source gas, and may often be unable to operate for detecting a source gas concentration. In such a case, a mass spectrograph is separated from a CVD reaction chamber and they are put in fluid communication with each other through a nozzle or an orifice, and both a mass spectrograph and a CVD reaction chamber are differentially exhausted by means of separate vacuum equipments to thereby be kept evacuated. By analyzing source gas molecules introduced through a nozzle or an orifice, the above mentioned operation can be obtained with prevention of contamination to a mass spectrograph, even if a pressure at which a film is deposited on a substrate by CVD is too high A calibration gas may be employed to further enhance repeatability. A predetermined amount of a calibration gas is introduced into a CVD reaction chamber apart from a source gas, and a signal magnitude of a source gas is compared to a signal magnitude of a calibration gas to thereby obtain a ratio between the signal magnitudes of source and calibration gases, which ratio means a ratio in concentration between source and calibration gases. The above mentioned operation can be accomplished also by this process.

Even if sensitivity of a mass spectrograph is lowered due to long term use and/or contamination thereto, when sensitivity to both source and calibration gases is lowered to the same degree, an influence by lowered sensitivity can be cancelled. As a result, it would be possible to deposit a film with higher repeatability. A noble gas such as helium (He) is suitable as a calibration gas, because a noble gas less influences CVD reaction and has quite small risk of being decomposed or mixed with other gases during mass spectrometry.

As mentioned so far, an apparatus and a method for depositing a film on a substrate in accordance with the present invention employs a mass spectrograph equipped in a CVD reaction chamber to thereby make it possible to detect concentrations of each of source gases in a CVD reaction chamber during a film is being deposited. By adjusting an amount of a source in accordance with the thus detected source gas concentration, it is possible to control an amount of a solid or liquid source unlike the conventional methods by which it was quite difficult or impossible to control an amount of a solid or liquid source, resulting in repeatability in film deposition which in turn enhances productivity in semiconductor device fabrication.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
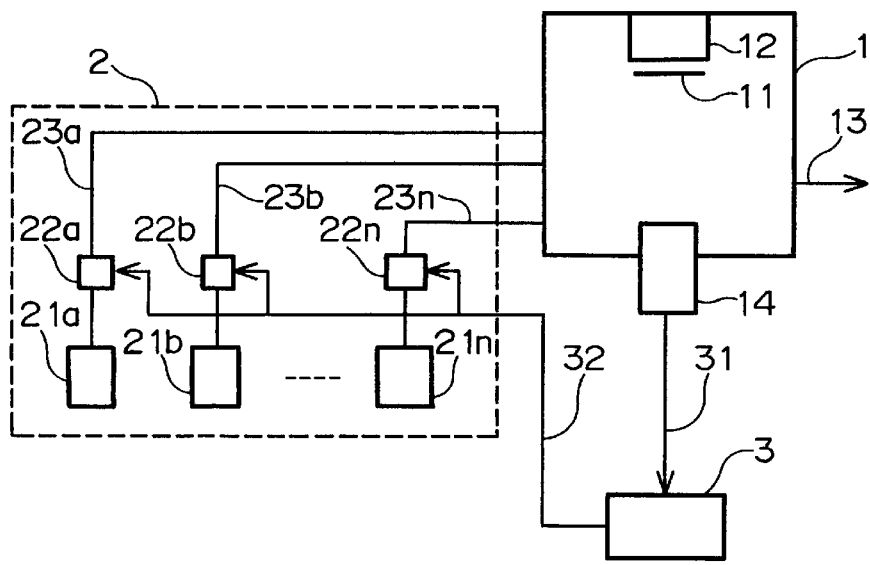
FIG. 1 is a schematic view illustrating an apparatus of depositing a film on a substrate by CVD in accordance with the first embodiment of the present invention.

FIG. 1 is a schematic view illustrating an apparatus of depositing a film on a substrate by CVD in accordance with the first embodiment of the present invention. The illustrated apparatus essentially includes a reaction chamber 1 in which CVD is accomplished, a source supply system 2 for supplying a plurality of solid or liquid sources to the reaction chamber 1, and a signal processing device 3 for processing signals transmitted from a mass spectrograph 14 equipped with the reaction chamber 1.

The reaction chamber 1 includes a reaction exciter 12 for facilitating film deposition on a substrate 11, a gas exhauster 13 for exhausting gases out of the reaction chamber 1 therethrough, and a mass spectrograph 14 equipped therewith. For instance, the reaction exciter 12 includes a heater for heating the substrate 11 and/or a plasma generator.

The source supply system 2 includes a plurality of source containers 21a to 21n, a plurality of volume adjusters 22a to 22n for adjusting an amount of sources to be supplied to the reaction chamber 1, and a plurality of conduits 23a to 23n. Each of the volume adjusters 22a to 22n adjusts an amount of a solid or liquid source supplied from each of the source containers 21a to 21n, and the thus adjusted amount of a source is introduced into the reaction chamber 1 through each of the conduits 23a to 23n.

The signal processing device 3 receives signals from the mass spectrograph 14 through a signal path 31, and transmits an instruction signal to each of the volume adjusters 22a to 22n through a signal path 32. Each of the volume adjusters 22a to 22n adjusts an amount of a solid or liquid source to a certain amount in accordance with a received instruction signal.

The illustrated apparatus further includes a gas source supply system 5 for employing a gas source for accomplishing CVD together with a solid or liquid source supplied from the source supply system 2.

In accordance with the instant embodiment, a film is deposited on the substrate 11 as follows. The substrate 11 on which a film is to be deposited is placed on the reaction chamber 1. In film deposition by CVD, source gases are supplied into the reaction chamber 1 from the source containers 21a to 21n, and then the source gases are made to react by means of the reaction exciter 12 to thereby deposit a film on the substrate 11. The used source gases are exhausted out of the reaction chamber 1 through the gas exhauster 13.

While a film is being deposited on the substrate 11, an amount of source gases to be supplied to the reaction chamber 1 is controlled as follows. First, a part of source gases to be supplied to the reaction chamber 1 is introduced into the mass spectrograph 14 for analysis of a mass number of each of the source gases. The thus detected mass number of each of the source gases may be considered as indicating a concentration of the source gas in the reaction chamber 1.

The mass spectrograph 14 transmits the signal processing device 3 signals indicating the detected mass numbers of the source gases through the signal path 31, and then the signal processing device 3 compares a concentration represented by the thus received signal to a predetermined target concentration for each of the source gases. If there is a deviation between them, the signal processing device 3 transmits the volume adjusters 22a to 22n correction signals through the signal path 32. On receipt of the correction signals, the volume adjusters 22a to 22n adjust an amount of source gases in accordance with the correction signals so that a concentration thereof approaches and finally gets equal to the target gas concentration. Thus, a concentration of each of the source gases in the reaction chamber 1 is adjusted.

The above mentioned steps make a one cycle, and this cycle is repeated in the desired number. Namely, there is carried out so-called negative feedback, by which source gases are introduced in an optimal amount into the reaction chamber 1, resulting in that a concentration of each of the source gases in the reaction chamber 1 may be kept constant at an intended value.

In the instant embodiment, though a plurality of sources is employed, there is prepared a single mass spectrograph 14. Thus, the above mentioned mass spectrometry and adjusting in an amount of a source gas are repeated for each of the source gases. A plurality of mass spectrographs may be equipped with the reaction chamber 1 for simultaneously carrying out mass spectrometry and adjusting an amount of a source gas for each of the source gases.

Figure 2:
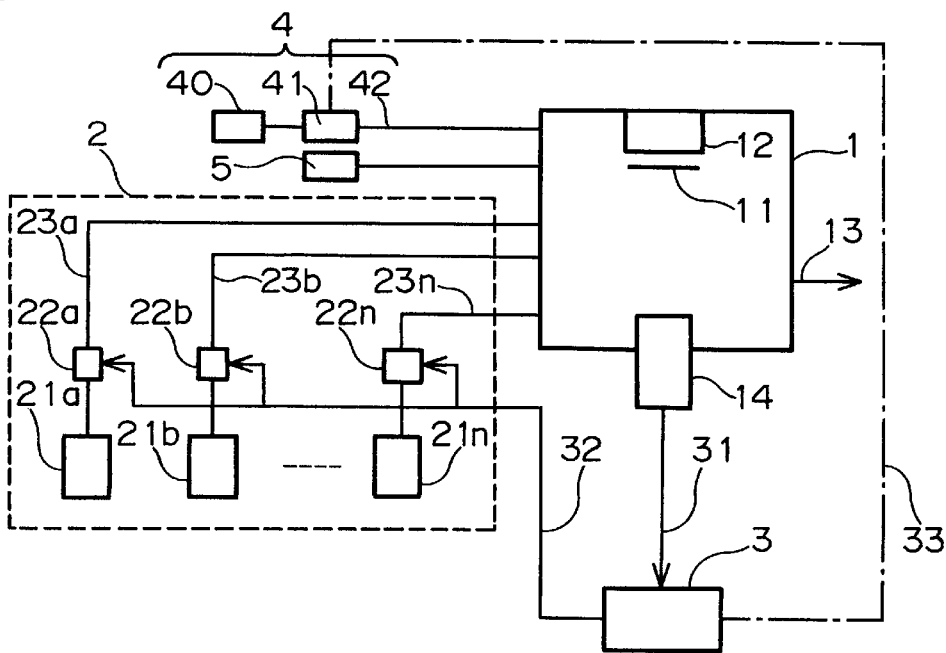
FIG. 2 is a schematic view illustrating an apparatus of depositing a film on a substrate by CVD in accordance with the second embodiment of the present invention.

FIG. 2 illustrates an apparatus in accordance with the second embodiment of the present invention. The illustrated apparatus is different from the apparatus illustrated in FIG. 1 in that the illustrated apparatus further includes a calibration gas introduction system 4 for employing a calibration gas in order to enhance accuracy in mass spectrometry.

The calibration gas introduction system 4 includes a calibration gas container 40, a flow rate adjuster 41 for controlling a flow rate of a calibration gas supplied from the calibration gas container 40, and a gas conduit 42 through which an adjusted flow rate of calibration gas is introduced into the reaction chamber 1.

The calibration gas is employed to deal with fluctuation in analysis accuracy of the mass spectrograph 14 which fluctuation would be caused, for instance, due to contamination of the mass spectrograph 14. As the calibration gas, there is employed a gas which is not mixed with the source gases, such as a noble gas. The calibration gas contained in the container 40 is introduced into the flow rate adjuster 41, which in turn introduces a constant flow rate of the calibration gas into the reaction chamber 1 through the gas conduit 42. In the instant embodiment, the mass spectrograph 14 carries out mass spectrometry about both the source gases and the calibration gas, and determines a ratio of the mass number of each of the source gases and the mass number of the calibration gas. The thus obtained ratio for each of the source gases may be employed as an indication of a concentration of a source gas in the reaction chamber 1.

The signal processing device 3 receives signals indicating the above mentioned ratio for each of the source gases from the mass spectrograph 14, and transmits the flow rate adjuster 42 an instruction signal by which the flow rate adjuster 42 adjust a flow rate of the calibration gas so that the ratio gets closer to a predetermined target ratio. As an alternative, the signal processing device 3 may transmit the volume adjusters 22a to 22n instruction signals by which an amount of the source gases is adjusted so that the ratio gets closer to a predetermined target ratio.

Thus, the apparatus in accordance with the second embodiment makes it possible to control an amount of a source with higher repeatability than the apparatus in accordance with the first embodiment having no calibration gas supply system.

Figure 3:
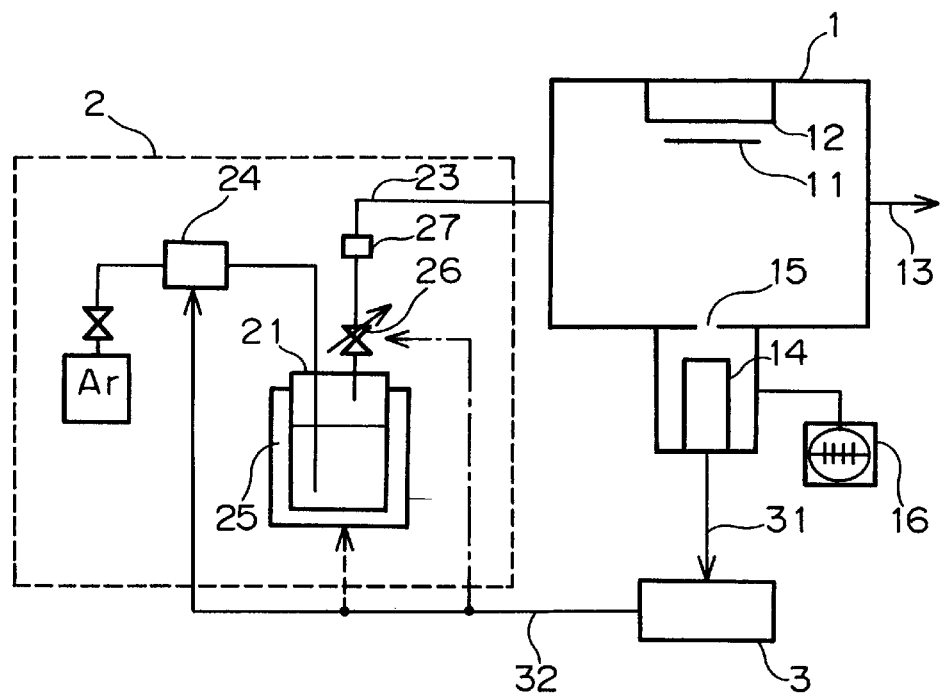
FIG. 3 is a schematic view illustrating an apparatus of depositing a film on a substrate by CVD in accordance with the third embodiment of the present invention.

FIG. 3 illustrates an apparatus in accordance with the third embodiment. Parts or elements corresponding to those in the first embodiment have been provided with the same reference numerals. The illustrated apparatus employs a single species of a fluid source. Specifically, the illustrated apparatus employs titanium iso-propoxide (Ti (i-OC$_3$H$_7$)$_4$, hereinafter referred to simply as "TIP") as a source to thereby deposit a film made of titanium dioxide (TiO$_2$) on a substrate.

TIP is fluid at room temperature. A source container 21 made of stainless steel is filled with TIP which is bubbled with a carrier gas controlled in an amount by a flow rate controller 24. In the instant embodiment, there is employed argon (Ar) as a carrier gas. The source container 21 is equipped with a temperature adjuster 25 for controlling a temperature of TIP and a pressure adjuster 26 for adjusting a pressure in the source container 21. A flow rate of TIP to be supplied to the reaction chamber 1 through a source conduit 23 is controlled by a mass flow controller 27 (MFC).

The reaction chamber 1 is kept to have a pressure at 1 Torr by the gas exhauster 13. A quadrupole type mass spectrograph is employed as the mass spectrograph 14. The reaction chamber 1 is separated from the mass spectrograph 14, and they are in fluid communication with each other through an orifice 15 having a diameter of 0.5 mm. The mass spectrograph 14 is differentially exhausted by a turbo molecular pump 16 to thereby be kept at a pressure of $1 \times 10^{-4}$ Torr or smaller.

In the reaction chamber 1, there is placed the substrate 11 having a diameter of 4 inches. The film deposition exciter 12 has a heater by which the substrate 11 is heated to thereby accomplish film deposition on the substrate 11. The substrate 11 is a silicon wafer on a surface of which is formed a silicon dioxide (SiO$_2$) film having a thickness of 200 nm. The substrate 11 is kept at 600° C.

As is obvious in view of the above mentioned equation (A), there are three ways for increasing (or decreasing) an amount of a source to be supplied to the reaction chamber 1: (a) to increase (or decrease) a vapor pressure of a source, that is, to make a temperature of a source higher (or lower); (b) to increase (or decrease) a flow rate of a carrier gas; and (c) to decrease (or increase) a pressure in a source container. Hence, one or more of those three ways (a) to (c) is(are) carried out to control an amount of a source in accordance with a gas concentration in the reaction chamber 1 measured by the mass spectrograph 14.

In the instant embodiment, an amount of a source is adjusted by the second way (b), namely by increasing or decreasing a flow rate of a carrier gas. The signal processing device 3 transmits the carrier gas flow rate controller 24 an instruction signal through the signal path 32 indicated with a solid line. A source container 21 is kept at a pressure of 200 Torr and at a temperature of 40° C. A signal magnitude of the mass number of 48 in the mass spectrograph 14 is chosen as an indication of a source gas concentration in the reaction chamber 1. The mass number of 48 corresponds to mass of titanium molecule (48) having the greatest existence probability among stable isotopes of titanium. Since source molecules are decomposed in the mass spectrograph 14, many signals are found in TIP mass spectrum which signals indicate a mass number of titanium atom, a mass number of isopropyl group and so on as well as a mass number of TIP. The reason why a signal magnitude corresponding to a mass number of titanium atom is selected as an indication of a source gas concentration in the reaction chamber 1 is that the signal magnitude can be readily distinguished from signal magnitudes corresponding to other molecules.

The signal magnitude transmitted from the mass spectrograph 14 is processed by the signal processing device 3 to thereby control a flow rate of a carrier gas.

There were conducted experiments by employing the apparatus illustrated in FIG. 3 for investigating a film deposition rate by depositing a film made of $TiO_2$ with a flow rate of a carrier gas being varied. As a result, it was confirmed that when a $TiO_2$ film was deposited in the above mentioned conditions in the instant embodiment, a film deposition rate was almost in proportion to a flow rate of a carrier gas, or an amount of a source.

There was conducted an experiment employing the apparatus in accordance with the third embodiment, as follows. An optimal source gas concentration by which a desired $TiO_2$ film deposition rate could be obtained was in advance measured, and then such an optimal source gas concentration was kept unchanged by increasing or decreasing a flow rate of a carrier gas in accordance with the present invention. Under such conditions, a film was deposited on the substrate 11 a lot of times to thereby check repeatability of a film deposition rate.

Figure 4:
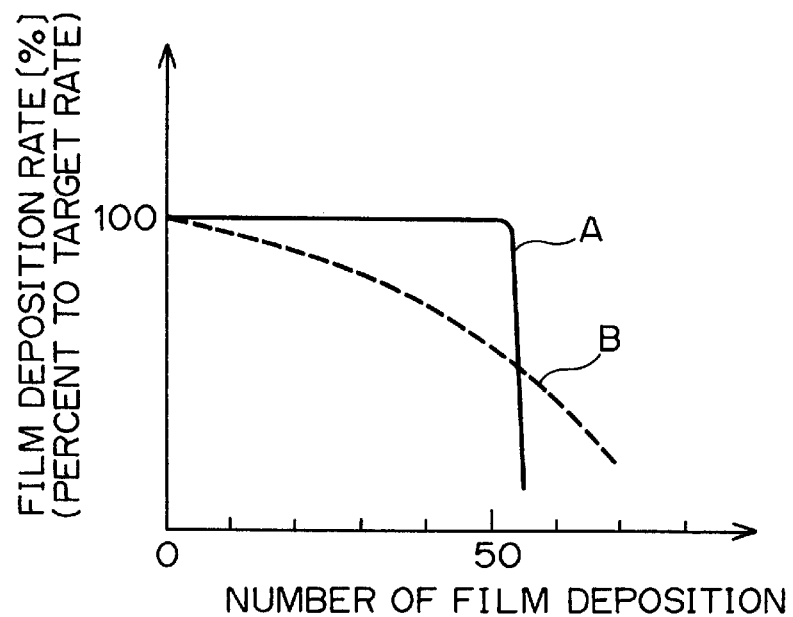
FIG. 4 is a graph showing a relation between the number of film deposition and a film deposition rate in the apparatus illustrated in FIG. 3.

In a graph illustrated in FIG. 4, a solid line A indicates fluctuation in a film deposition rate when film depositions are repeated in accordance with the third embodiment under conditions that 10 grams of TIP is contained in the source container 21 and one film deposition is carried out in 60 minutes. In an ordinate axis of the graph, a target film deposition rate is indicated as 100%. For comparison with the solid line A, a broken line B indicates fluctuation in a film deposition rate when film depositions are repeated in accordance with a conventional method in which a control in an amount of a source by increasing or decreasing a flow rate of a carrier gas is not carried out. In a film deposition in accordance with the conventional method, a film deposition was repeated under the same conditions as the third embodiment and with a flow rate of a carrier gas, a pressure in a source container and a temperature of a source all being fixed to initial dimensions.

As is seen in the graph illustrated in FIG. 4, a film deposition rate is gradually lowered when a film is deposited in accordance with the conventional method, as indicated with a broken line B. In contrast, it is understood that a film deposition rate is kept constant over more than 50 times of film deposition when a film is deposited in accordance with the present invention. As mentioned earlier, a $TiO_2$ film deposition rate is proportional to an amount of a source to be supplied into the reaction chamber 1. Thus, a film deposition rate in the conventional method is gradually lowered, as an amount of a source in the reaction chamber 1 is decreased.

In contrast, in a film deposition carried out in accordance with the present invention, a film deposition rate is kept constant, which means that an amount of a source to be supplied to the reaction chamber 1 is kept constant. Thus, it was confirmed that repeatability in a film deposition rate can be obtained by virtue of the inventive apparatus and method in which a source gas concentration in a reaction chamber is detected by means of a mass spectrograph, and an optimal source gas concentration in a reaction chamber is kept constant by increasing or decreasing a flow rate of a carrier gas.

As is understood in view of FIG. 4, a film deposition rate is gradually lowered when a film is deposited in accordance with a conventional method. In contrast, a film deposition rate is suddenly lowered at about 50 times of film deposition when a film is deposited in accordance with the present invention. This is because a source contained in the source container 21 was exhausted. Accordingly, the present invention having a step of detecting a source gas concentration in a reaction chamber provides another advantage that it is possible to exactly know when a source container has to be refilled with a source.

Then, an amount of a source is adjusted in the apparatus illustrated in FIG. 3 either by making a temperature of a source higher or lower or by increasing or decreasing a pressure in a source container. The results are completely the same as those shown in FIG. 4, and it was possible to deposit a film on a substrate at a constant film deposition rate, until a source contained in a source container is exhausted. Thus, it was confirmed that an amount of a source may be controlled by adjustment of a temperature of a source or by adjustment of a pressure in a source container.

Figure 5:
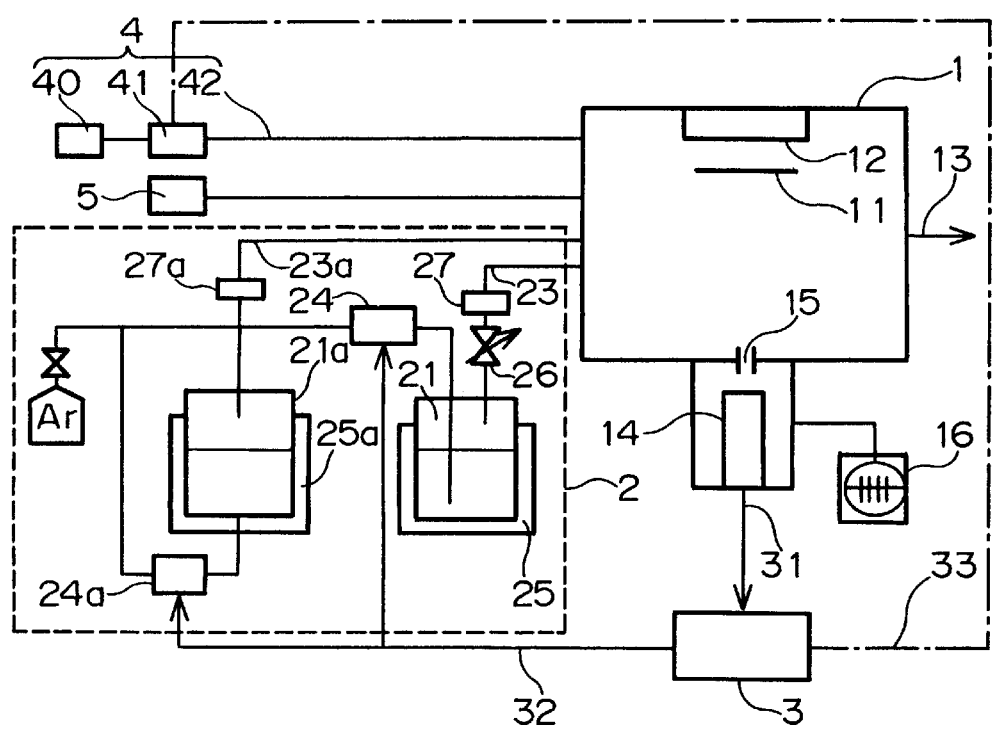
FIG. 5 is a schematic view illustrating an apparatus of depositing a film on a substrate by CVD in accordance with the fourth embodiment of the present invention.

FIG. 5 illustrates an apparatus in accordance with the fourth embodiment by which a polyphyletic film is deposited employing a plurality of sources. Specifically, the illustrated apparatus is for depositing a film made of strontium titanate ($SrTiO_3$), employing TIP, bis-(dipivaloylmethanato) strontium ($Sr(C_{11}H_{19}O_2)_2$) (hereinafter, referred to simply as "$Sr(DPM)_2$"), and an oxygen gas ($O_2$) as an oxidation gas.

The illustrated apparatus is different from the apparatus in accordance with the third embodiment illustrated in FIG. 3 in that the solid or liquid source supply system 2 includes a $Sr(DPM)_2$ supply system 21a to 25a as well as the TIP supply system 21 to 26, that the apparatus includes a calibration gas supply system 4 which is the same as that of the first embodiment illustrated in FIG. 1, and that the apparatus further includes a gas source supply system 5 for supplying an oxygen gas to the reaction chamber 1.

$Sr(DPM)_2$ is solid (powder) at room temperature. A source container 21a made of stainless steel is filled with $Sr(DPM)_2$ which is bubbled with a carrier gas controlled in an amount by a flow rate controller 24a. The carrier gas passes through the source powder to thereby introduce the source powder to the reaction chamber 1. In the instant embodiment, there is employed argon (Ar) as a carrier gas, and a flow rate of $Sr(DPM)_2$ to be supplied to the reaction chamber 1 through a source conduit 23a is controlled by a mass flow controller 27a (MFC). The source container 21a is equipped with a temperature adjuster 25a for controlling a temperature of $Sr(DPM)_2$. A pressure in the source container 21 is not controlled. This is because $Sr(DPM)_2$ is heated at about 150° C. or greater, and hence it is difficult to regularly operate a pressure controller at such a high temperature.

In the instant embodiment, a source temperature is fixed at 180° C. An amount of $Sr(DPM)_2$ to be supplied to the reaction chamber 1 is adjusted by increasing or decreasing a flow rate of a carrier gas. In the above mentioned equation (A), a pressure P in the source container 21a is a function of a flow rate of a carrier gas. If a flow in the source supply system 2 is compressive viscous flow, a pressure in the source container 21a is in proportion to the half power of a flow rate of a carrier gas. Thus, an amount of a source is almost in proportion to the half power of a flow rate of a carrier gas. Accordingly, even if a pressure in the source container 21a is not controlled, it is considered to be possible to adjust an amount of a source by increasing or decreasing a flow rate of a carrier gas.

The apparatus in accordance with the fourth embodiment has the same TIP supply system as that of the second embodiment illustrated in FIG. 3. An amount of a source is adjusted by increasing or decreasing a flow rate of a carrier gas. An oxygen gas supplied from the gas source supply system 5 is controlled in a flow rate thereof by a mass flow controller(not illustrated), and is introduced into the reaction chamber 1. A signal magnitude corresponding to a mass number of 48 is selected for indicating a gas concentration of TIP in the reaction chamber 1, and a signal magnitude corresponding to a mass number of 88 is selected for indicating a gas concentration of $Sr(DPM)_2$. A mass number of 88 is a mass number of stable isotope of strontium having the greatest existence probability.

In the instant embodiment, a calibration gas is employed for measuring a gas concentration by means of a mass spectrograph. The signal processing device 3 converts measured signal magnitudes of TIP and $Sr(DPM)_2$ to ratios in concentration between them and a calibration gas, and controls an amount of TIP and $Sr(DPM)_2$ so that the concentration ratios are kept constant. As a calibration gas is employed a helium gas (He), which is controlled in a flow rate by a mass flow controller (MFC) and is introduced at 1 sccm to the reaction chamber 1.

Before carrying out film deposition, there were in advance determined optimal ratios in gas concentration in the reaction chamber 1 of Ti and Sr to a calibration gas at which ratios a desired $SrTiO_3$ film deposition rate was obtained and an existence ratio between Sr and Ti in a deposited film was 1:1. Then, a film was deposited on the substrate 11 by increasing or decreasing a flow rate of a carrier gas for each of Ti and Sr so that the above mentioned optimal ratios were kept unchanged. By repeating film deposition under the above mentioned conditions, repeatability about a film deposition rate and a film composition was examined. For comparison, a film was deposited on the substrate 11 also in accordance with a conventional method in which a flow rate of a carrier gas for each of the sources was fixed to initial flow rate. In either case, TIP of 20 grams and $Sr(DPM)_2$ of 10 grams were contained in each of the source containers. A time for one film deposition was set 60 minutes.

Figure 6:
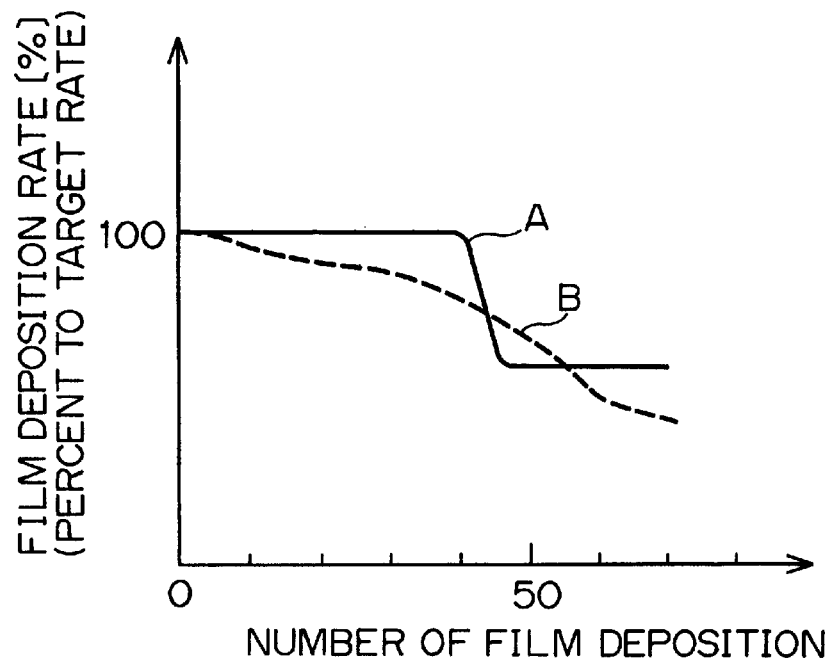
FIG. 6 is a graph showing a relation between the number of film deposition and a film deposition rate in the apparatus illustrated in FIG. 5.

In a graph illustrated in FIG. 6, a solid line A shows fluctuation in a film deposition rate to the number of film depositions. A deposition rate is gradually lowered when a film is repeatedly deposited on the substrate 11 in accordance with a conventional method, as indicated with a broken line B. This means that a total amount of a source in the reaction chamber 1 is decreasing. In contrast, when a film is deposited in accordance with the present invention, as indicated with a solid line A, a film deposition rate is kept constant over more than 40 times of film deposition.

Figure 7:
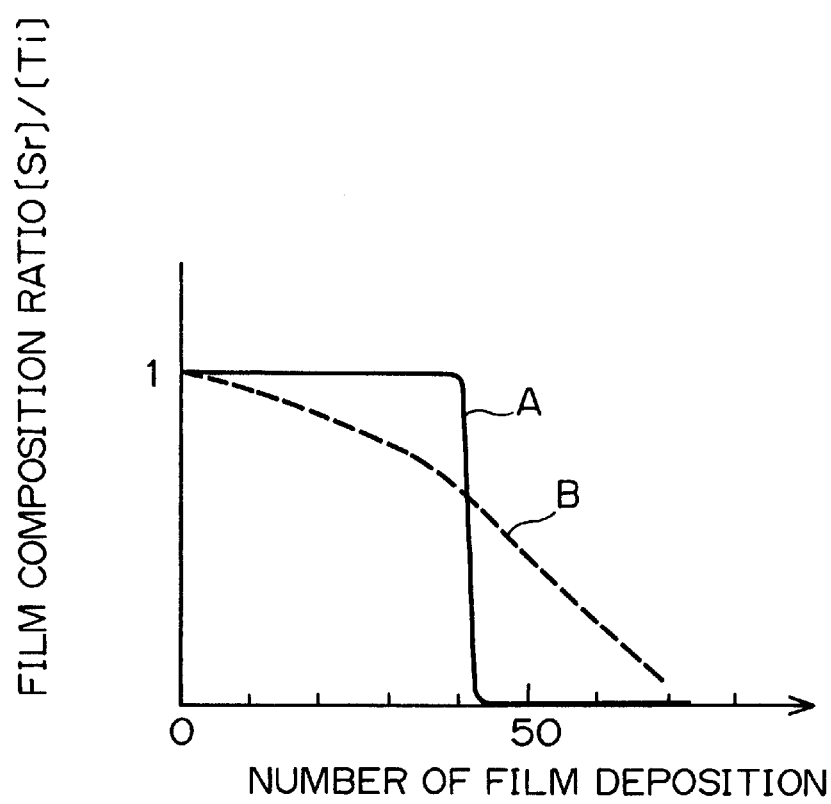
FIG. 7 is a graph showing a relation between the number of film deposition and a film composition in the apparatus illustrated in FIG. 5.

FIG. 7 is a graph illustrating fluctuation in a film composition to the number of film deposition. When a film is deposited in accordance with a conventional method, as indicated with a broken line B, a composition ratio of Sr to Ti([Sr]/[Ti]) is gradually reduced as a film is repeatedly deposited. The reason of the reduction is that an amount of $Sr(DPM)_2$ supplied to the reaction chamber 1 is more rapidly reduced than an amount of TIP supplied to the reaction chamber 1.

In contrast, when a film is deposited in accordance with the present invention, as indicated with a solid line A, a composition ratio of 1:1 is kept unchanged over more than 40 times of film deposition. The reason why a composition ratio is suddenly reduced after about 40 times of film deposition is that Sr as a source is exhausted.

The analysis with reference to FIGS. 6 and 7 shows that, in a conventional method in which an amount of a source to be supplied to the reaction chamber is not controlled, amounts of $Sr(DPM)_2$ and TIP are reduced with repetition of film deposition, resulting in that a film deposition rate is reduced, and that a film composition is varied because of a difference in a degree of the reduction in a film deposition rate. of $Sr(DPM)_2$ supplied In contrast, in accordance with the present invention in which an amount of a source is controlled based on a gas concentration in the reaction chamber measured by means of a mass spectrograph, it is possible to keep both a film deposition and a film composition unchanged for a lot of times of film deposition. That is, it is confirmed that the present invention is effectively applicable to a polyphyletic film made employing a plurality of sources, and that the present invention enhances repeatability in a film deposition rate and a film composition.

A magnitude of a signal indicating helium employed as a calibration gas is reduced by about 20% while a film deposition is repeated about 40 times, and hence sensitivity of a mass spectrograph is found to be reduced. The reason is consider that $Sr(DPM)_2$ is likely to be condensed in the reaction chamber because of its low vapor pressure, and the thus condensed $Sr(DPM)_2$ adheres to an orifice separating the reaction chamber from the mass spectrograph or to inside of the mass spectrograph, resulting in reduction in sensitivity. However, even if sensitivity of a mass spectrograph is reduced, repeatability in a film deposition rate and a film composition can be obtained, as mentioned above. Thus, it is confirmed that the inventive method in which a calibration gas is employed and a ratio in gas concentration between a source gas and a calibration gas is calculated for controlling an amount of a source gas is quite useful.

Thus, an apparatus and a method in accordance with the present invention for depositing a film on a substrate make it possible to control an amount of a source in CVD in which a solid or liquid source is employed, and enhance repeatability in a film deposition rate and a film composition.

While the present invention has been explained with reference to the preferred embodiments, it is to be understood that the present invention makes it possible to carry out precise control an amount of a solid or liquid source, which was almost impossible in accordance with conventional methods, by detecting a source gas concentration in a reaction chamber by means of a mass spectrograph equipped in a reaction chamber, and adjusting an amount of a source based on the thus detected source gas concentration. As a result, there is obtained repeatability in a film deposition and a film composition. The present invention is applicable to film deposition by CVD employing a plurality of solid or liquid sources as well as film deposition CVD employing a single source, and also applicable to deposition of a polyphyletic film by CVD. In addition, by introducing a calibration gas into a reaction chamber and taking a ratio in a gas concentration between a source gas and a calibration gas, it is possible to further enhance such repeatability as mentioned above regardless of fluctuation in sensitivity of a mass spectrograph.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-160116 filed on Jun. 20, 1996 including specification, claims, drawings and summary is incorporated herein by reference in its entirety.

What is claimed is:

1. An apparatus for depositing a film on a substrate by chemical vapor deposition, comprising:
   (a) a reaction chamber in which a film is deposited on a substrate by chemical vapor deposition;
   (b) a source supply for supplying source to said reaction chamber for accomplishing chemical vapor deposition;
   (c) a system for supplying a calibration gas to said reaction chamber, wherein said calibration gas is a noble gas; and
   (d) a mass spectrograph for detecting a concentration ratio of said source to said calibration gas and transmitting an instruction signal based on detection to said source supply for controlling an amount of said source to be supplied to said reaction chamber.

2. The apparatus as set forth in claim 1, wherein said source is solid or liquid.

3. The apparatus as set forth in claim 1, wherein said mass spectrograph detects a concentration of said source by introducing a part of said source thereinto.

4. The apparatus as set forth in claim 1, wherein the reaction chamber is separated from the mass spectrograph, and wherein said reaction chamber is in liquid communication with said mass spectrograph.

5. The apparatus as set forth in claim 4, further comprising a nozzle for liquid-communicating said reaction chamber to said mass spectrograph.

6. The apparatus as set forth in claim 1, further comprising vacuum devices for separately making said reaction chamber and said mass spectrograph evacuated.

7. The apparatus as set forth in claim 1, wherein said apparatus includes a plurality of mass spectrographs.

8. The apparatus as set forth in claim 1, wherein said mass spectrograph detects a mass number of said source as an indication of a concentration of said source.

* * * * *